(12) United States Patent
Ishii

(10) Patent No.: US 9,136,793 B2
(45) Date of Patent: Sep. 15, 2015

(54) RESONATOR ELEMENT, RESONATOR, ELECTRONIC DEVICE, ELECTRONIC APPARATUS, AND METHOD OF MANUFACTURING RESONATOR ELEMENT

(71) Applicant: Seiko Epson Corporation, Tokyo (JO)

(72) Inventor: Osamu Ishii, Tatsuno (JP)

(73) Assignee: Seiko Epson Corporation (JP)

( * ) Notice: Subject to any disclaimer, the term of this patent is extended or adjusted under 35 U.S.C. 154(b) by 10 days.

(21) Appl. No.: 13/910,599

(22) Filed: Jun. 5, 2013

(65) Prior Publication Data

US 2013/0328637 A1 Dec. 12, 2013

(30) Foreign Application Priority Data

Jun. 6, 2012 (JP) ................................. 2012-128661

(51) Int. Cl.
| | |
|---|---|
| H03B 5/32 | (2006.01) |
| H03H 3/04 | (2006.01) |
| H03H 9/02 | (2006.01) |
| H03H 9/05 | (2006.01) |
| H03H 9/10 | (2006.01) |

(52) U.S. Cl.
CPC . *H03B 5/32* (2013.01); *H03H 3/04* (2013.01); *H03H 9/02157* (2013.01); *H03H 9/0542* (2013.01); *H03H 9/1021* (2013.01)

(58) Field of Classification Search
CPC ...................................................... H03B 5/32
USPC ............................. 331/107 R, 154, 155, 156
See application file for complete search history.

(56) References Cited

U.S. PATENT DOCUMENTS

| | | | |
|---|---|---|---|
| 6,750,593 B2 | 6/2004 | Iwata | |
| 7,235,913 B2* | 6/2007 | Iwata | ............................. 310/320 |
| 7,902,721 B2 | 3/2011 | Maeda | |
| 8,164,235 B2 | 4/2012 | Koyama | |
| 2003/0020564 A1* | 1/2003 | Nishimura et al. | ........... 333/187 |
| 2004/0200054 A1* | 10/2004 | Nakagawara et al. | .......... 29/594 |
| 2005/0200240 A1* | 9/2005 | Tanaka | .......................... 310/333 |
| 2011/0068660 A1* | 3/2011 | Naito et al. | ................... 310/367 |

FOREIGN PATENT DOCUMENTS

| | | |
|---|---|---|
| JP | 03-116882 | 5/1991 |
| JP | 03-139911 | 6/1991 |
| JP | 2000-040938 A | 2/2000 |
| JP | 2001-196890 A | 7/2001 |
| JP | 2001-244778 A | 9/2001 |
| JP | 2003-037476 A | 2/2003 |
| JP | 2003-087087 A | 3/2003 |
| JP | 2003-087089 A | 3/2003 |
| JP | 2003-309445 A | 10/2003 |

(Continued)

*Primary Examiner* — Joseph Chang
*Assistant Examiner* — Jeffrey Shin
(74) *Attorney, Agent, or Firm* — Harness, Dickey & Pierce, P.L.C.

(57) ABSTRACT

A resonator element includes a substrate including a vibrating portion that performs thickness-shear vibration and an excitation electrode provided on top and bottom main surfaces of the vibrating portion. Assuming that the average plate thickness calculated from the plate thicknesses of a plurality of regions of the vibrating portion is H and the plate thickness difference, which is a difference between the maximum and minimum values of the plate thicknesses of the plurality of regions of the vibrating portion, is ΔH, 0%<ΔH/H≤0.085% is satisfied as a relationship between H and ΔH.

8 Claims, 12 Drawing Sheets

(56) References Cited

FOREIGN PATENT DOCUMENTS

| JP | 2005-072710 A | 3/2005 |
| JP | 2005-244735 A | 9/2005 |
| JP | 2006-129383 A | 5/2006 |
| JP | 2006-238115 A | 9/2006 |
| JP | 2006-270465 A | 10/2006 |
| JP | 2008-005333 A | 1/2008 |
| WO | WO-2007032444 A1 | 3/2007 |
| WO | WO-2009020022 A1 | 2/2009 |

* cited by examiner

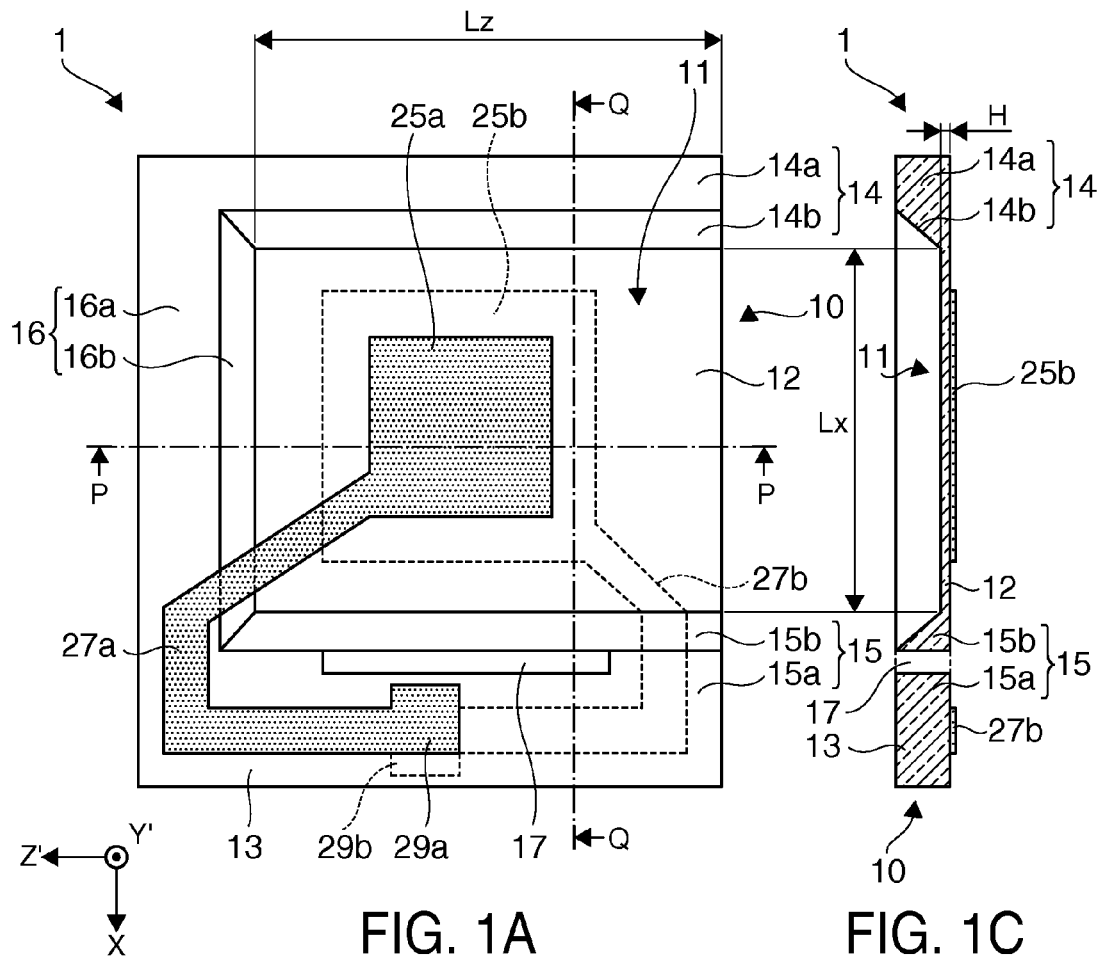
FIG. 1A
FIG. 1C
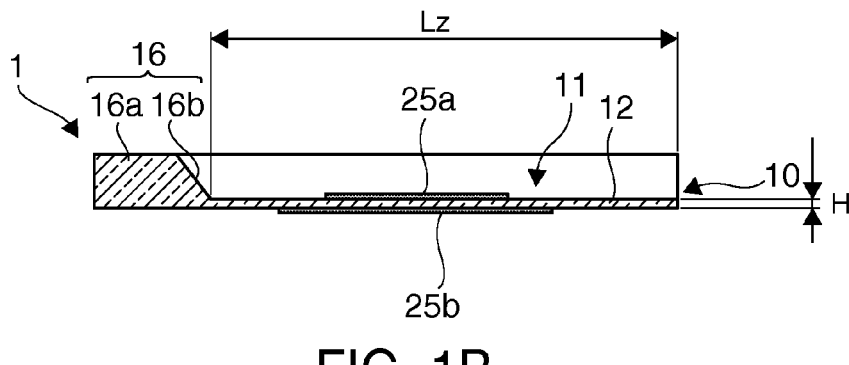
FIG. 1B

ST11 (SUBSTRATE WASHING)

ST12 (Cr-Au DEPOSITION)

ST13 (RESIST APPLICATION)

ST14 (EXPOSURE AND DEVELOPMENT)

ST15 (Cr-Au FILM ETCHING)

ST16 (SUBSTRATE ETCHING)

ST17 (PEELING OFF OF RESIST AND Cr-Au FILM)

ST15 (Cr-Au FILM ETCHING)

ST15-1 (WASHING AND IMMERSION INTO HOT WATER)

ST16 (SUBSTRATE ETCHING 1)

ST16-1 (TURNING SUBSTRATE UPSIDE DOWN AND SUBSTRATE ETCHING 2)

ST17 (PEELING OFF OF RESIST AND Cr-Au FILM)

RESONATOR ELEMENT, RESONATOR, ELECTRONIC DEVICE, ELECTRONIC APPARATUS, AND METHOD OF MANUFACTURING RESONATOR ELEMENT

BACKGROUND

1. Technical Field

The present invention relates to a resonator element that excites in a thickness-shear vibration mode, a resonator, an electronic device, an electronic apparatus, and a method of manufacturing a resonator element.

2. Related Art

A quartz crystal resonator, in which an AT cut quartz crystal resonator element whose main vibration is excited in a thickness-shear vibration mode is used, is used in various fields, such as a piezoelectric oscillator and an electronic apparatus, since the quartz crystal resonator is suitable for miniaturization and higher frequencies and exhibits a three-dimensional curve with an excellent frequency-temperature characteristic. In particular, in recent years, as the processing speed of transmission and communication equipment or OA equipment increases or the amount of communication data or the progressing amount increases, request for higher frequencies is growing for the quartz crystal resonator as a reference frequency signal source used in the equipment. In the AT cut quartz crystal resonator element that excites in a thickness-shear vibration mode, since there is an inverse relationship between the frequency and the plate thickness of a vibrating portion, the plate thickness of the vibrating portion is generally set to be small in order to obtain higher frequencies. For this reason, in order to obtain higher frequencies, a thin vibrating portion is provided at the bottom of a recessed portion, which is formed in the middle of the quartz crystal substrate by dry etching or wet etching from one surface side or both surface sides, and main electrodes for exciting the vibrating portion are formed on the top and bottom main surfaces of the vibrating portion and lead electrodes extending in the outer peripheral direction are formed on both surfaces of the quartz crystal substrate.

However, there is a relationship in which the equivalent series inductance L1 of the equivalent circuit constant increases as the degree of parallelism of the vibrating portion of the quartz crystal resonator element degrades. Accordingly, in the case of a high-frequency quartz crystal resonator element having a resonance frequency of 100 MHz or higher, the plate thickness of the vibrating portion located at the bottom of the recessed portion becomes very small (16.7 μm or less). As a result, since the degree of degradation of the degree of parallelism with respect to the plate thickness of the vibrating portion becomes large, an influence on the equivalent series inductance L1 also becomes very large. For this reason, even with the degree of parallelism of the vibrating portion that has hardly caused a problem in a low-frequency quartz crystal resonator element, the equivalent series inductance L1 becomes larger than the design value and the variation is also increased in a high-frequency quartz crystal resonator element. Therefore, there has been a problem in that the yield of the quartz crystal resonator element is significantly reduced.

JP-A-2005-72710 discloses a manufacturing method for improving the degree of parallelism by dividing a vibrating portion formed in a recessed portion into three regions, measuring the plate thickness of each region, and then performing local etching using a resist as a protective film.

In the manufacturing method disclosed in JP-A-2005-72710, however, when local etching of a plurality of vibrating portions formed in a large quartz crystal substrate is simultaneously performed, a photomask corresponding to the plate thickness of each vibrating portion is required in order to form a protective film. Accordingly, since it is necessary to prepare a photomask corresponding to the plate thickness of a vibrating portion for each large quartz crystal substrate at the time of mass production, the manufacturing cost is increased due to the cost for generating the photomask and the like. As a result, cost reduction has been in demand. In addition, in the case of a high-frequency quartz crystal resonator element having a resonance frequency of 200 MHz or higher, the electrode also becomes small as the thickness of the vibrating portion decreases. Therefore, since the degree of parallelism of a portion in which the electrode is formed cannot be improved just by dividing the vibrating portion into three regions, there has been a problem in that the variation in the equivalent series inductance L1 or the equivalent series capacitance C1 is large and unwanted spurious is caused.

SUMMARY

An advantage of some aspects of the invention is to solve at least a part of the problems described above, and the invention can be implemented as the following forms or application examples.

APPLICATION EXAMPLE 1

This Application Example is directed to a resonator element including a substrate including a vibrating portion that performs thickness-shear vibration and an excitation electrode provided on top and bottom main surfaces of the vibrating portion. Assuming that an average plate thickness calculated from plate thicknesses of a plurality of regions of the vibrating portion is H and a plate thickness difference, which is a difference between maximum and minimum values of the plate thicknesses, is $\Delta H$, $0\% < \Delta H/H \leq 0.085\%$ is satisfied as a relationship between H and $\Delta H$.

According to this application example, in the high-frequency resonator element that excites in a thickness-shear vibration mode of the fundamental mode, it is not necessary to divide the excitation electrode to correct the degree of parallelism of the vibrating portion and it is possible to reduce the equivalent series inductance L1 proportional to the degree of parallelism of the vibrating portion, that is, the plate thickness difference $\Delta H$ by setting the average plate thickness H of the vibrating portion and the plate thickness difference $\Delta H$ to satisfy the relationship of $0\% < \Delta H/H \leq 0.085\%$. Accordingly, there is an effect that a resonator element, in which the degradation of CI or the capacitance ratio $\gamma$ is suppressed, a variation in the equivalent series inductance L1 or the equivalent series capacitance C1 is small, and spurious near the resonance frequency is suppressed, can be obtained.

APPLICATION EXAMPLE 2

The resonator element according to the application example may be configured such that the substrate includes the vibrating portion and a thick portion that is unified with an outer edge of the vibrating portion and has a larger thickness than the vibrating portion.

According to this application example, since even a high-frequency resonator element having a very thin vibrating portion can be mounted in a thick portion united with the vibrating portion, there is an effect that a highly reliable resonator element with excellent impact resistance or vibration resistance can be obtained.

APPLICATION EXAMPLE 3

The resonator element according to the application example may be configured such that a resonance frequency is equal to or higher than 200 MHz.

According to this application example, since the plate thickness becomes very small if the frequency becomes a high frequency equal to or higher than 200 MHz in the fundamental mode, the influence on the degree of parallelism of the substrate before processing the shape of the recessed portion becomes very large. Therefore, setting the relationship between the average plate thickness H of the vibrating portion and the plate thickness difference ΔH within the above-described range is effective in that a resonator element, in which a variation in the equivalent series inductance L1 or the equivalent series capacitance C1 is small and spurious near the resonance frequency is suppressed, can be obtained.

APPLICATION EXAMPLE 4

This application example is directed to a resonator including: the resonator element according to the application example described above; and a package in which the resonator element is housed.

According to this application example, the influence of disturbance, such as a temperature change or a humidity change, or the influence of contamination can be prevented by housing the resonator element in a package. Therefore, there is an effect that a resonator, which has excellent frequency reproducibility, frequency-temperature characteristic, CI-temperature characteristic, and frequency-aging characteristic, and in which a variation in the equivalent series inductance L1 or the equivalent series capacitance C1 is small and spurious near the resonance frequency is suppressed, can be obtained.

APPLICATION EXAMPLE 5

This Application Example is directed to an electronic device including: the resonator element according to the application example described above; and an oscillation circuit that excites the resonator element.

According to this application example, since the resonator element in which a variation in the equivalent series inductance L1 or the equivalent series capacitance C1 is small and spurious near the resonance frequency is suppressed is used, there is an effect that a small electronic device that is not affected by spurious and has a stable oscillation characteristic can be obtained.

APPLICATION EXAMPLE 6

This application example is directed to an electronic apparatus including the resonator element according to the application example described above.

According to this application example, the resonator element in which a variation in the equivalent series inductance L1 or the equivalent series capacitance C1 is small and spurious near the resonance frequency is suppressed can be directly mounted onto the mounting board using the Chip On Board (COB) technique. Therefore, since the mounting area is reduced, there is an effect that a small electronic apparatus including a good reference frequency source having a stable oscillation characteristic can be configured.

APPLICATION EXAMPLE 7

This application example is directed to an electronic apparatus including the resonator according to the application example described above.

This application example provides an effect that an electronic apparatus, which has excellent frequency stability and includes a good reference frequency source, can be configured by using a resonator or an electronic device, in which a variation in the equivalent series inductance L1 or the equivalent series capacitance C1 is small and spurious near the resonance frequency is suppressed, in the electronic apparatus.

APPLICATION EXAMPLE 8

This application example is directed to a method of manufacturing a resonator element including: preparing a substrate on which a mask with an opening is formed; immersing the substrate into hot water containing a surfactant; and etching a region exposed from the opening of the mask on the substrate. The etching includes turning the substrate upside down and immersing the substrate into the hot water during etching.

According to this application example, in the etching of a recessed portion, it is possible to prevent a variation in the etching rate that degrades the degree of parallelism of the vibrating portion. Therefore, there is an effect that a resonator element, in which a variation in the equivalent series inductance L1 or the equivalent series capacitance C1 is small and spurious near the resonance frequency is suppressed, can be manufactured.

BRIEF DESCRIPTION OF THE DRAWINGS

The invention will be described with reference to the accompanying drawings, wherein like numbers reference like elements.

FIGS. 1A to 1C are schematic diagrams showing the structure of a piezoelectric resonator element according to an embodiment of the invention, where FIG. 1A is a plan view of the piezoelectric resonator element, FIG. 1B is a cross-sectional view taken along the line P-P, and FIG. 1C is a cross-sectional view taken along the line Q-Q.

FIG. 6A is a diagram showing the resonance characteristic when the plate thickness difference is large and FIG. 6B is a diagram showing the resonance characteristic when there is almost no plate thickness difference.

FIG. 11A is a plan view of the piezoelectric resonator and FIG. 11B is a longitudinal sectional view.

FIG. 12A is a plan view of the electronic device and FIG. 12B is a longitudinal sectional view.

DESCRIPTION OF EXEMPLARY EMBODIMENTS

Figure 2:
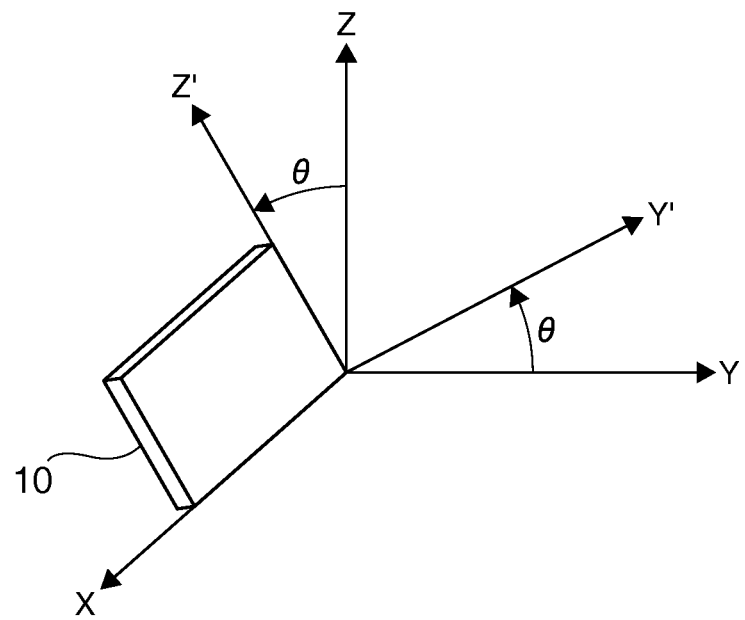
FIG. 2 is a diagram for explaining the relationship between the AT cut quartz crystal substrate and the crystallographic axes according to an embodiment of the invention.
Figure 3A:
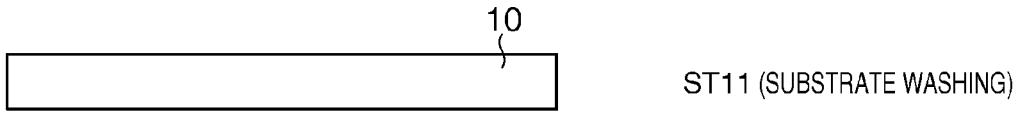
FIGS. 3A to 3G are cross-sectional views of the process showing a manufacturing method for forming a recessed portion of a resonator element in the related art.
Figure 3B:
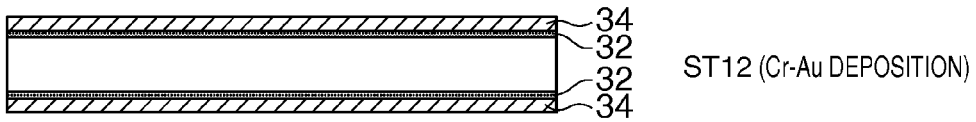
Figure 3C:
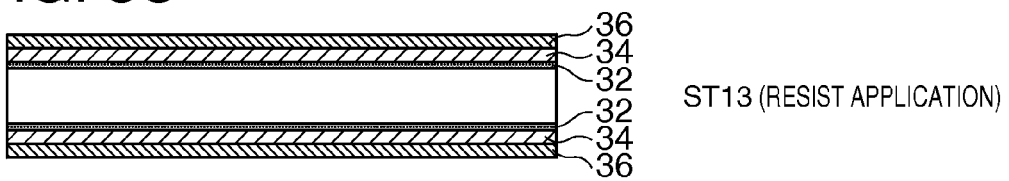
Figure 3D:
Figure 3E:
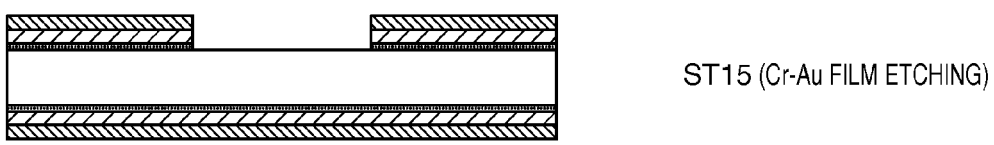
Figure 3F:
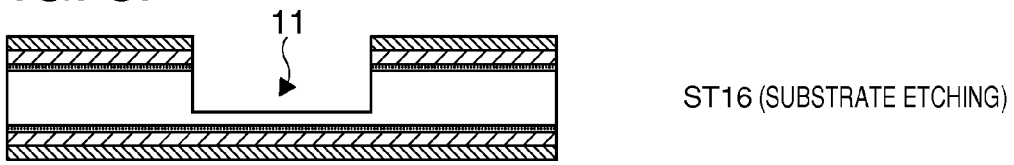
Figure 3G:
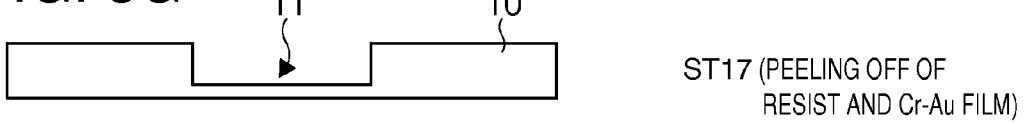

Hereinafter, an embodiment of the invention will be described in detail with reference to the accompanying drawings. FIGS. 1A to 1C are schematic diagrams showing the configuration of a piezoelectric resonator element that is an example of a resonator element according to an embodiment of the invention. FIG. 1A is a plan view of the piezoelectric resonator element, FIG. 1B is a cross-sectional view taken along the line P-P of FIG. 1A, and FIG. 1C is a cross-sectional view taken along the line Q-Q of FIG. 1A.

Structure of a Resonator Element

A piezoelectric resonator element 1 includes: a piezoelectric substrate 10 having a thin vibrating portion 12 and a thick portion 13 that is provided so as to be connected to the vibrating portion 12 and has a thickness larger than the vibrating portion 12; excitation electrodes 25a and 25b formed so as to face both main surfaces (top and bottom surfaces in the ±Y' direction) of the vibrating portion 12, respectively; and lead electrodes 27a and 27b formed so as to extend from the excitation electrodes 25a and 25b toward pad electrodes 29a and 29b provided in the thick portion.

The piezoelectric substrate 10 has a rectangular shape, and includes: the vibrating portion 12 that is thin, is perpendicular to the Y' axis, and has a fixed thickness; the thick portion 13 formed by a first thick portion 14, a second thick portion 15, and a third thick portion 16 (also referred to as first to third thick portions 14 to 16) that are unified along the three sides of the vibrating portion 12 excluding one side; and a slit 17 for preventing stress, which is caused at the time of support and fixing, from being transmitted to the vibrating portion 12.

In addition, a first thick portion body 14a, a second thick portion body 15a, and a third thick portion body 16a (also referred to as first to third thick portion bodies 14a to 16a) refer to a region that is parallel to the Y' axis and has a fixed thickness.

In addition, a first inclined portion 14b, a second inclined portion 15b, and a third inclined portion 16b (also referred to as first to third inclined portions 14b to 16b) refer to an inclined surface generated between the first to third thick portion bodies 14a to 16a and the vibrating portion 12.

One main surface of the vibrating portion 12 and one surface of each of the first to third thick portions 14 to 16 are on the same plane, that is, on the X-Z' plane of the coordinate axes shown in FIGS. 1A to 1C. This surface (bottom surface side in the −Y' direction of FIG. 1B) is called a flat surface (plane), and an opposite surface (top surface side in the +Y' direction of FIG. 1B) on which a recessed portion 11 is provided is called a recessed surface.

The excitation electrodes 25a and 25b that drive the piezoelectric substrate 10 are formed so as to face the main surfaces of the substantially central portion of the vibrating portion 12.

The lead electrode 27a extending from the excitation electrode 25a formed on the recessed surface side is electrically connected to the pad electrode 29a, which is formed on the recessed surface of the second thick portion body 15a, through the third inclined portion 16b and the third thick portion body 16a from the upper side of the vibrating portion 12.

In addition, the lead electrode 27b extending from the excitation electrode 25b formed on the flat surface side is electrically connected to the pad electrode 29b, which is formed on the flat surface of the second thick portion body 15a, through the edge of the flat surface of the piezoelectric substrate 10.

In the embodiment shown in FIG. 1A, an example is shown in which the excitation electrodes 25a and 25b have rectangular shapes with different areas. However, the invention does not need to be limited to this, and the areas of the excitation electrodes 25a and 25b may be the same and the shapes may be circular or elliptical.

In addition, the lead electrodes 27a and 27b are examples of the lead structure, and the lead electrode 27a may be provided through another thick portion. However, it is preferable that the lengths of the lead electrodes 27a and 27b be shortest, and it is preferable to suppress an increase in the electrostatic capacitance by disposing the lead electrodes 27a and 27b so as not to cross each other with the piezoelectric substrate 10 interposed therebetween.

In addition, the excitation electrodes 25a and 25b, the lead electrodes 27a and 27b, and the pad electrodes 29a and 29b are formed, for example, by depositing nickel (Ni) on a base and depositing gold (Au) on the nickel (Ni) film using a vapor deposition apparatus or a sputtering apparatus. In addition, as an electrode material, it is possible to use chromium (Cr)

instead of nickel (Ni) on the base and use silver (Ag) or platinum (Pt) instead of gold (Au).

In the piezoelectric resonator element 1, an electric field is generated in the vibrating portion 12 between the excitation electrodes 25a and 25b by the excitation current input from the pad electrodes 29a and 29b, and the vibrating portion 12 is vibrated by the piezoelectric effect. When forming the piezoelectric substrate 10 using a quartz crystal belonging to the trigonal piezoelectric material, the piezoelectric substrate 10 has crystallographic axes X, Y, and Z perpendicular to each other as shown in FIG. 2. The X, Y, and Z axes are called an electrical axis, a mechanical axis, and an optical axis, respectively. A flat plate cut along the plane obtained by rotating the XZ plane by a predetermined angle θ around the X axis is used as the piezoelectric substrate 10.

For example, in the case of the AT cut quartz crystal substrate, the angle θ is 35.25° (35° 15'). Here, if the Y and Z axes are rotated by the angle θ around the X axis to obtain Y' and Z' axes, the AT cut quartz crystal substrate has crystallographic axes X, Y', and Z' perpendicular to each other. Therefore, in the AT cut quartz crystal substrate, the thickness direction is the Y' axis, and a surface including the X and Z' axes perpendicular to the Y' axis is a main surface, and thickness-shear vibration is excited as a main vibration on the main surface. The piezoelectric substrate 10 is formed from the AT cut quartz crystal substrate formed in this manner. In addition, the piezoelectric substrate 10 according to the present embodiment is not limited to the AT cut quartz crystal substrate having an angle θ of 35.25° shown in FIG. 2. For example, the piezoelectric substrate 10 according to the present embodiment may also be a quartz crystal substrate, such as a BT-cut quartz crystal substrate that excites thickness-shear vibration.

Method of Manufacturing a Recessed Portion in the Related Art

Next, a method of manufacturing a recessed portion of the resonator element according to an embodiment of the invention will be described with reference to cross-sectional views of the process for forming a recessed portion of the resonator element shown in FIGS. 3A to 3G.

First, the piezoelectric substrate 10 is washed with pure water (ST11), and then a base film 32 is provided on each of the top and bottom main surfaces of the piezoelectric substrate 10. The base film 32 is provided to compensate for gold (Au) that serves as a corrosion resistant film 34 and has weak adhesion to the piezoelectric substrate 10. As the base film 32, for example, chromium (Cr) is deposited using a vapor deposition apparatus or a sputtering apparatus. On the chromium (Cr) film, gold (Au) is deposited as the corrosion resistant film 34 using a vapor deposition apparatus or a sputtering apparatus (ST12).

Then, a resist 36 is applied to the entire surface of the corrosion resistant film 34 (ST13), and a mask for forming a recessed portion of a resonator element is formed by exposing and developing the resist 36 (ST14).

Then, gold (Au) that is the corrosion resistant film 34 exposed from the mask opening is etched using a potassium iodide solution, for example, and then chromium (Cr) that is the base film 32 is etched using a ceric ammonium nitrate solution (ST15).

Then, for example, in the case of a quartz crystal substrate, the piezoelectric substrate 10 exposed from the mask opening is etched using an ammonium fluoride solution or the like (ST16). In this manner, the recessed portion 11 is formed on the piezoelectric substrate 10.

Then, the resist 36 is peeled off, and all of the base film 32 and the corrosion resistant film 34 are removed using the above-described two solutions (ST17). Then, the piezoelectric resonator element 1 is completed by performing an outer shape forming step and an electrode forming step.

Figure 4:
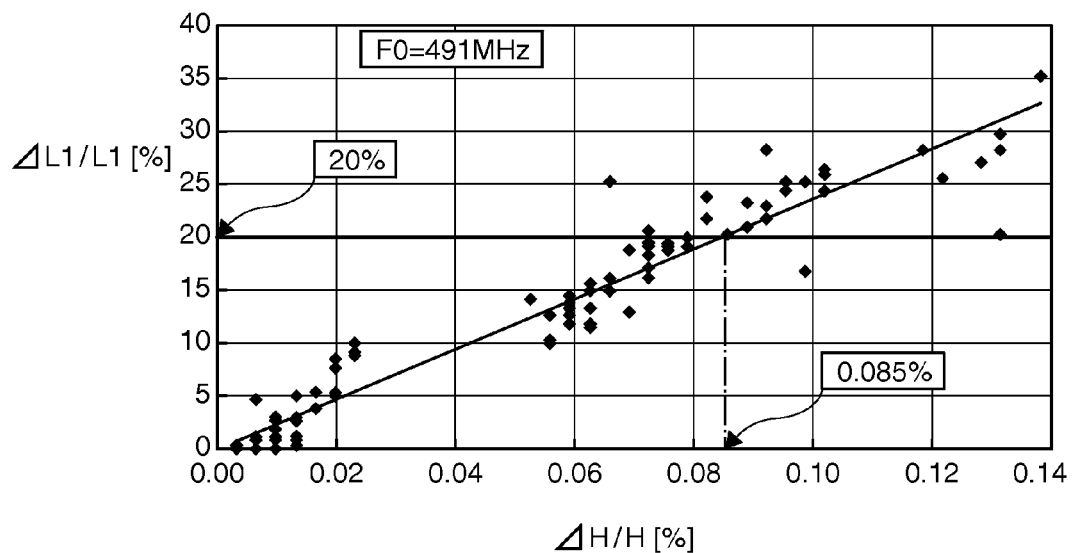
FIG. 4 is a diagram showing the relationship between ΔH/H of the plate thickness and ΔL1/L1 of the inductance L1 of the AT cut quartz crystal resonator having a resonance frequency of 491 MHz band according to an embodiment of the invention.

FIG. 4 is a diagram showing the relationship between $\Delta H/H$ of the plate thickness and $\Delta L1/L1$ of the equivalent series inductance L1 in the vibrating portion 12 of an AT cut quartz crystal resonator having a resonance frequency of 491 MHz band according to the embodiment of FIGS. 1A to 1C, the AT cut quartz crystal resonator being manufactured as a sample using a manufacturing method in the related art.

Figure 5:
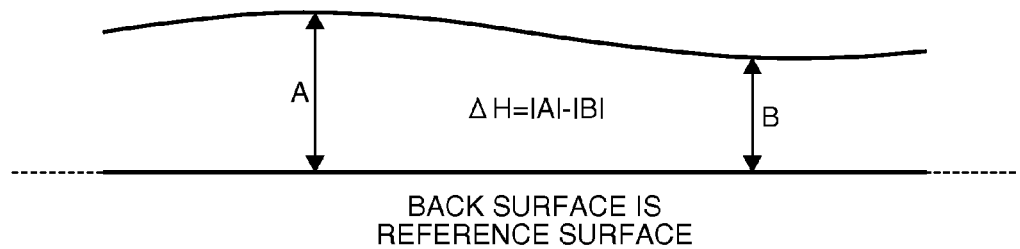
FIG. 5 is a schematic diagram for explaining the plate thickness difference ΔH according to an embodiment of the invention.

Here, the average plate thickness H and the plate thickness difference $\Delta H$ are defined with reference to TTV measurement (FIG. 5) described in 3.7.5 Total Thickness Variation (TTV) in technical standards QIAJ-B-007 "Single quartz crystal for surface acoustic wave device-standards and use guidance" of QIAJ (Quartz Crystal Industry Association of Japan). For the average plate thickness H and the plate thickness difference $\Delta H$, plate thicknesses of a total of nine places of four places of four corners located at the outer edge of the excitation electrode 25a formed in the vibrating portion 12, four places of midpoints of four corners along the outer edge of the excitation electrode 25a, and one place of the center position of the excitation electrode 25a are measured. The average plate thickness H is calculated from the plate thicknesses of the nine places, and the plate thickness difference between the maximum and minimum values of the nine plate thicknesses is defined as $\Delta H$. In addition, the equivalent series inductance $\Delta L1$ indicates the difference when the average value of five samples having $\Delta H/H$ equal to or less than 0.01% is set to L1.

FIG. 4 shows a tendency in which, as the degree of parallelism of the vibrating portion 12, that is, the plate thickness difference $\Delta H$ increases, the equivalent series inductance L1 increases and the variation increases. In addition, the equivalent series capacitance C1 relevant to the capacitance ratio γ (=C0/C1) is reduced since the equivalent series capacitance C1 is inversely proportional to the equivalent series inductance L1, and the equivalent parallel capacitance C0 is fixed since the equivalent parallel capacitance C0 is an electrostatic capacitance corresponding to the opposite area of the excitation electrodes 25a and 25b on the top and bottom surfaces. Accordingly, the capacitance ratio γ is increased. When the quartz crystal resonator with the increased capacitance ratio γ is used in a voltage-controlled quartz crystal oscillator (VCXO), the frequency variable range of the frequency variable characteristic becomes narrow. In addition, if the variation in the capacitance ratio γ is large, a variation in the frequency variable range is also increased, and this is disadvantageous in the characteristic.

For this reason, in order to suppress the variation in the frequency variable range of the voltage-controlled quartz crystal oscillator to 20% or less in consideration of the manufacturing yield, it is necessary to reduce the variation ($\Delta L1/L1$) in the equivalent series inductance L1 of the quartz crystal resonator to 20% or less. From FIG. 4, it can be said that it is preferable to suppress $\Delta H/H$ in the vibrating portion 12 to $0\% < \Delta H/H \leq 0.085\%$.

Figure 6A:
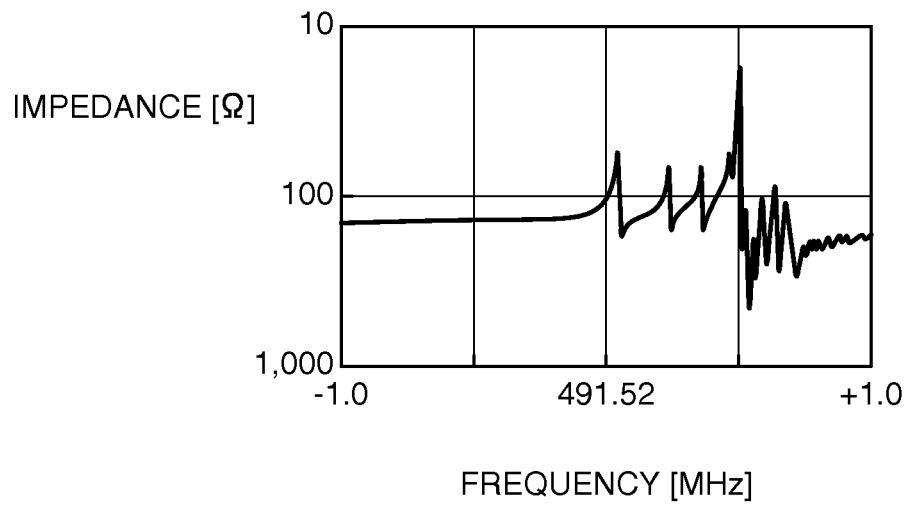
FIGS. 6A and 6B are diagrams for explaining the resonance characteristic of the AT cut quartz crystal resonator having a resonance frequency of 491 MHz band according to an embodiment of the invention, where
Figure 6B:
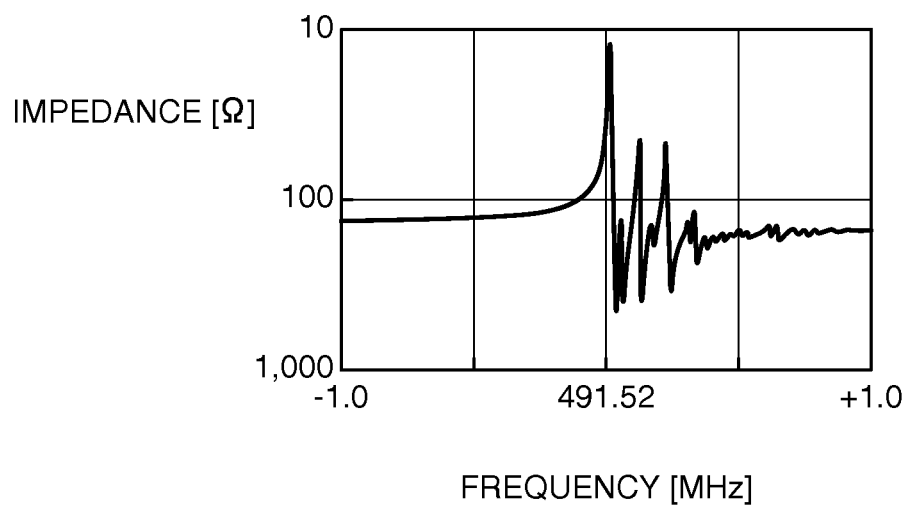
Figure 7A:
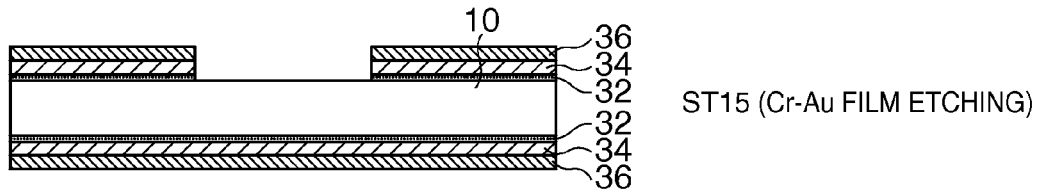
FIGS. 7A to 7E are cross-sectional views of the process showing an example of a manufacturing method for forming a recessed portion of the resonator element according to an embodiment of the invention.
Figure 7B:
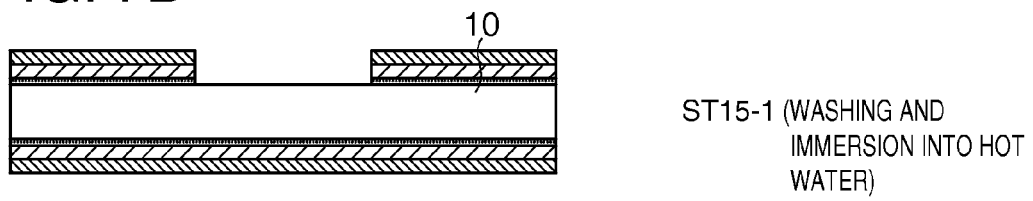
Figure 7C:
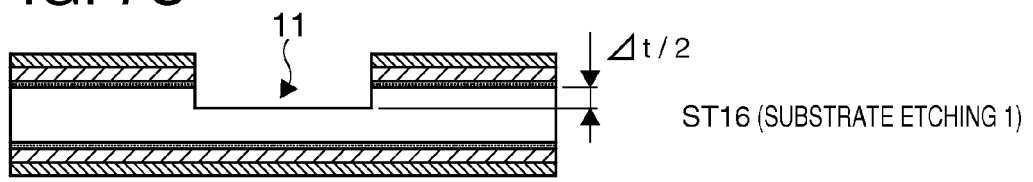
Figure 7D:
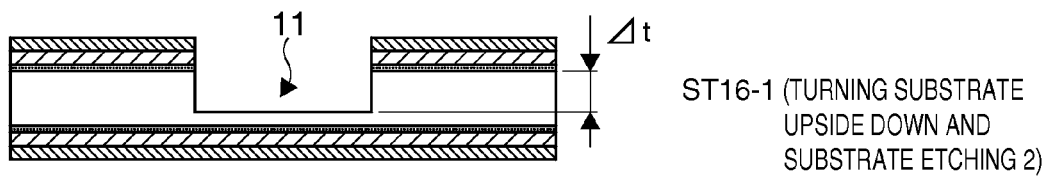
Figure 7E:
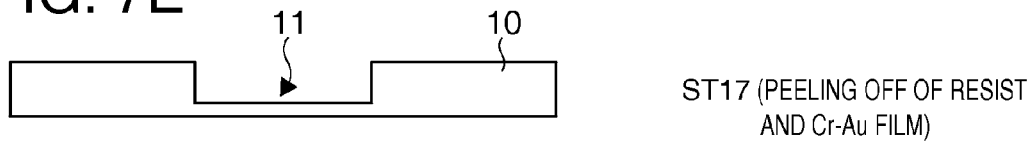

FIGS. 6A and 6B are diagrams showing the resonance characteristic of an AT cut quartz crystal resonator having a resonance frequency of 491 MHz band, where FIG. 6A shows the resonance characteristic when $\Delta H/H=0.13\%$ and FIG. 6B shows the resonance characteristic when $\Delta H/H=0.01\%$. Here, the resonance frequency of the AT cut quartz crystal resonator is about 491 MHz. The size of the vibrating portion 12 in the long side direction (X-axis direction) is 0.3 mm, and the size of the vibrating portion 12 in the short side direction (Z-axis direction) is 0.23 mm. Regarding the thickness of each of the excitation electrodes 25a and 25b on the top and bottom surfaces, the thickness of nickel (Ni) as a base is 7 nm and the thickness of gold (Au) on the nickel (Ni) film is 90 nm.

From FIG. 6A, when ΔH/H is large, the vibration distribution of main vibration is shifted from the center to the larger plate thickness side. Then, since the generation position of electrical charges is shifted from the lower side of the excitation electrode 25a to a non-electrode portion, CI of the main vibration is degraded due to the loss of electrical charges. For this reason, since CI of unwanted spurious becomes smaller than the main vibration, there is a problem in that the oscillator oscillates at the resonance frequency of the spurious when it is mounted in the oscillation circuit. In addition, since the vibration displacement distribution is asymmetrical, inharmonic spurious in the diagonal symmetric mode, in which electrical charges are normally offset and are not excited accordingly, is easy to occur. However, when ΔH/H of FIG. 6B is small, since the spurious is sufficiently suppressed against the main vibration, there is no possibility that the oscillator will oscillate at the resonance frequency of the spurious. Therefore, reducing ΔH/H of the vibrating portion 12 is also very effective in suppressing unwanted spurious.

The AT cut quartz crystal substrate having the recessed portion 11 is generally manufactured from a large quartz crystal substrate using a batch processing method in consideration of mass production or the manufacturing cost. Therefore, the degree of parallelism in a large quartz crystal substrate is important. In the current polishing technology, a quartz crystal substrate having a plate thickness of 70 μm and an area of about 40 mm×40 mm is processed in the degree of parallelism of about 0.2 μm in the quartz crystal substrate. Assuming that the quartz crystal substrate is etched while maintaining the degree of parallelism up to the plate thickness of 3.4 μm of 491 MHz, ΔH/H of 0.044% is obtained in a region of the vibrating portion 12 having an area of about 0.3 mm×0.3 mm. Accordingly, from FIG. 4, it is thought that the variation in the equivalent series inductance L1 of the quartz crystal resonator is equal to or less than about 12%. However, since the variation in the equivalent series inductance L1 (ΔL1/L1) is degraded up to about 40% in the present circumstances, the cause was examined.

As a result, it was apparent that there was a problem in the quartz crystal etching process for forming the recessed portion 11. The first cause was that the etching rate changed due to bubbles adhering to the recessed portion 11, from which quartz crystal was exposed, when etching the recessed portion 11. The second cause was that a quartz crystal substrate holding fixture moved up and down in order to make the liquid temperature of the etching bath uniform but a temperature difference occurred in the vertical direction in the etching bath and accordingly the etching rate changed.

Therefore, since it was thought that the adhesion of bubbles occurred due to the hydrophobic surface of the quartz crystal, a process of immersing the substrate into hot water containing a surfactant immediately before putting the substrate into the quartz crystal etching bath was added in order to increase the hydrophilicity of the quartz crystal surface. In addition, since making the etching rate uniform in the vertical direction in the etching bath was very difficult, including the modification of an apparatus, a process of turning the quartz crystal substrate placed in the etching bath upside down in the middle of quartz crystal etching was added. As a result, since the adhesion of bubbles was prevented and the change in the etching rate in the vertical direction in the etching bath was suppressed, it was possible to obtain the uniform etching rate in the recessed portion 11 and accordingly prevent the degradation of the degree of parallelism.

Method of Manufacturing a Recessed Portion

FIGS. 7A to 7E are cross-sectional views of the process showing a method of manufacturing a recessed portion of the resonator element according to an embodiment of the invention.

This method is the same as the manufacturing method in the related art shown in FIGS. 3A to 3G until the step (ST15) of etching gold (Au) as the corrosion resistant film 34 and chromium (Cr) as the base film 32 after the step (ST14) of forming a mask for forming a recessed portion of the resonator element from the step (ST11) of washing the piezoelectric substrate 10.

Then, the piezoelectric substrate 10 is fixed to the substrate holding fixture with the X-axis direction or Z'-axis direction of the piezoelectric substrate 10 as a vertical direction, is washed with pure water together with the substrate holding fixture, and is immersed into hot water that contains a surfactant and has almost the same temperature as the liquid temperature of the etching bath used in the next step (ST15-1). This is to prevent a change in the etching rate by maintaining the liquid temperature of the etching bath constant by warming the substrate holding fixture and the piezoelectric substrate 10.

Then, the piezoelectric substrate 10 exposed from the mask opening is put into the etching bath and is etched (ST16).

Then, in the middle of etching time until the vibrating portion 12 has a desired thickness, the substrate holding fixture and the piezoelectric substrate 10 are pulled up from the etching bath and the piezoelectric substrate 10 is turned upside down in the X-axis direction or the Z'-axis direction, and the piezoelectric substrate 10 is fixed to the substrate holding fixture and is immersed into hot water so that the piezoelectric substrate 10 is etched until the vibrating portion 12 has a desired thickness (ST16-1). In this manner, the recessed portion 11 is formed on the piezoelectric substrate 10.

Then, in the same manner as in the manufacturing method in the related art, the resist 36 is peeled off, and all of the base film 32 and the corrosion resistant film 34 are removed using the above-described two solutions (ST17). Then, the piezoelectric resonator element 1 is completed by performing an outer shape forming step and an electrode forming step.

In addition, in order to prevent the degradation of the degree of parallelism of the vibrating portion 12, a method of turning the piezoelectric substrate 10 upside down only once during etching has been illustrated as the manufacturing method shown in FIGS. 7A to 7E. However, turning the piezoelectric substrate 10 upside down during etching is not limited to one time, and may be performed multiple times.

Figure 8:
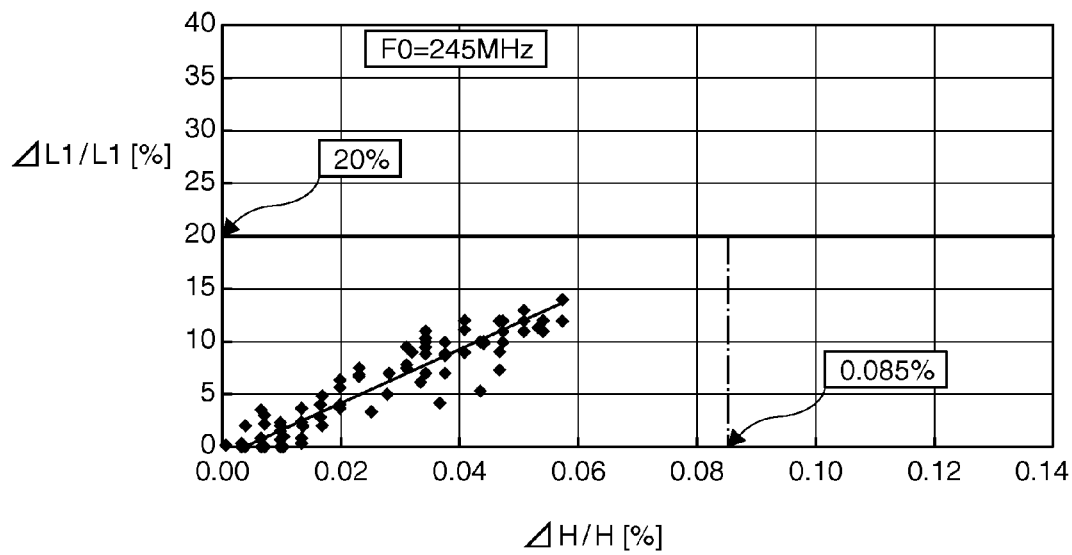
FIG. 8 is a diagram showing the relationship between ΔH/H of the plate thickness and ΔL1/L1 of the inductance L1 of the AT cut quartz crystal resonator having a resonance frequency of 245 MHz band manufactured as a sample using a manufacturing method according to an embodiment of the invention.
Figure 9:
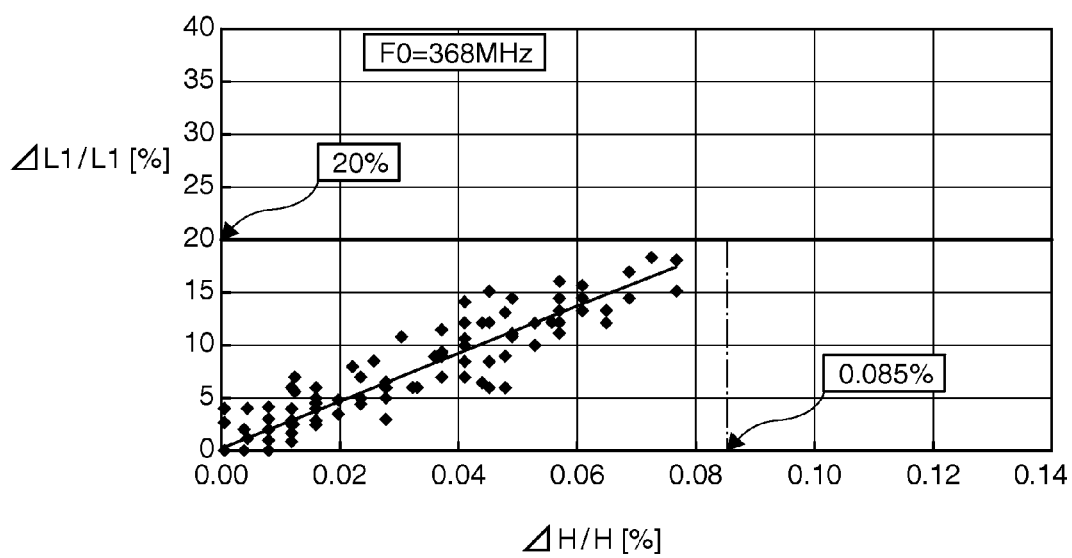
FIG. 9 is a diagram showing the relationship between ΔH/H of the plate thickness and ΔL1/L1 of the inductance L1 of the AT cut quartz crystal resonator having a resonance frequency of 368 MHz band manufactured as a sample using a manufacturing method according to an embodiment of the invention.
Figure 10:
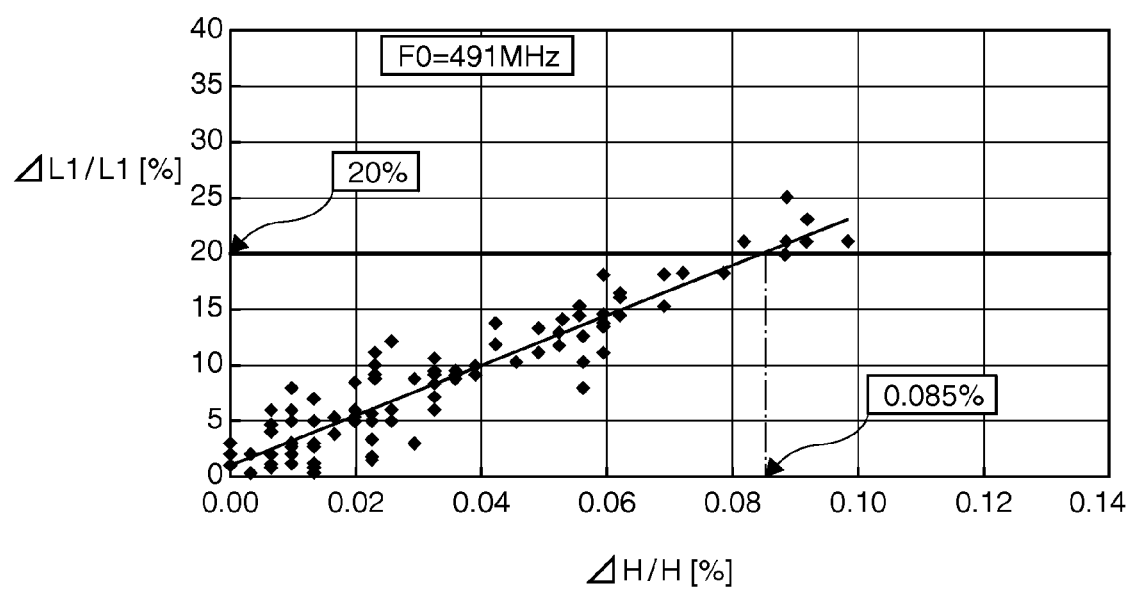
FIG. 10 is a diagram showing the relationship between ΔH/H of the plate thickness and ΔL1/L1 of the inductance L1 of the AT cut quartz crystal resonator having a resonance frequency of 491 MHz band manufactured as a sample using a manufacturing method according to an embodiment of the invention.

FIGS. 8 to 10 are diagrams showing the relationship between ΔH/H and ΔL1/L1 of the equivalent series inductance L1 with respect to the plate thickness of the vibrating portion 12 of each of AT cut quartz crystal resonators having resonance frequencies of 245 MHz band, 368 MHz band, and 491 MHz band according to the embodiment of FIGS. 1A to 1C, the AT cut quartz crystal resonators being manufactured as samples using the manufacturing method according to the embodiment shown in FIGS. 7A to 7E.

From FIGS. 8 and 9, since AT cut quartz crystal resonators having resonance frequencies of 245 MHz band and 368 MHz band are manufactured as samples using the manufacturing method shown in FIGS. 7A to 7E, ΔH/H in the vibrating portion 12 can be suppressed to the range of 0%<ΔH/H≤0.085%. Accordingly, it is possible to suppress the variation (ΔL1/L1) in the equivalent series inductance L1 to 20% or less.

However, in the AT cut quartz crystal resonator having a resonance frequency of 491 MHz band shown in FIG. 10, ΔH/H in the vibrating portion 12 could not be suppressed to the range of 0%<ΔH/H≤0.085% for all AT cut quartz crystal resonators. Meanwhile, when the AT cut quartz crystal resonator satisfying the range of 0%<ΔH/H≤0.085% is a non-defective product, the yield is 94% (94 (non-defective products)/100 (total number)). Since this is a significant improvement from 80% (80 (non-defective products)/100 (total number)) that is the yield in the manufacturing method in the related art shown in FIG. 4, it can be said that the manufacturing method shown in FIGS. 7A to 7E is very effective for improving the yield.

By turning the piezoelectric substrate 10 upside down in the X-axis direction or the Z'-axis direction multiple times in a step of improving the degree of parallelism after polishing of the piezoelectric substrate 10 or at the time of etching of the recessed portion 11 in the manufacturing process, it is possible to further suppress a change in the etching rate due to the change of liquid temperature in the vertical direction of the etching bath. Therefore, it is thought that it is possible to suppress ΔH/H in the vibrating portion 12 within the recessed portion 11 to the range of 0%<ΔH/H≤0.085%.

The degradation of the degree of parallelism by the etching process or the degree-of-parallelism standard of a quartz crystal substrate, which is less affected at the frequency of about 100 MHz in the thickness-shear vibration mode of the fundamental mode, has a very large influence on the variation of the constant if the frequency is increased to 200 MHz or higher since the thickness becomes very small. Therefore, at the high frequency of 200 MHz or higher, it is very effective for reducing the variation of the constant to prevent the degradation of the degree of parallelism of the vibrating portion 12. In addition, the upper limit of the frequency that can be manufactured in the current facility is expected to be about 800 MHz, and the limit of the constant variation is expected to be about 20% when the manufacturing yield is taken into consideration.

Figure 11A:
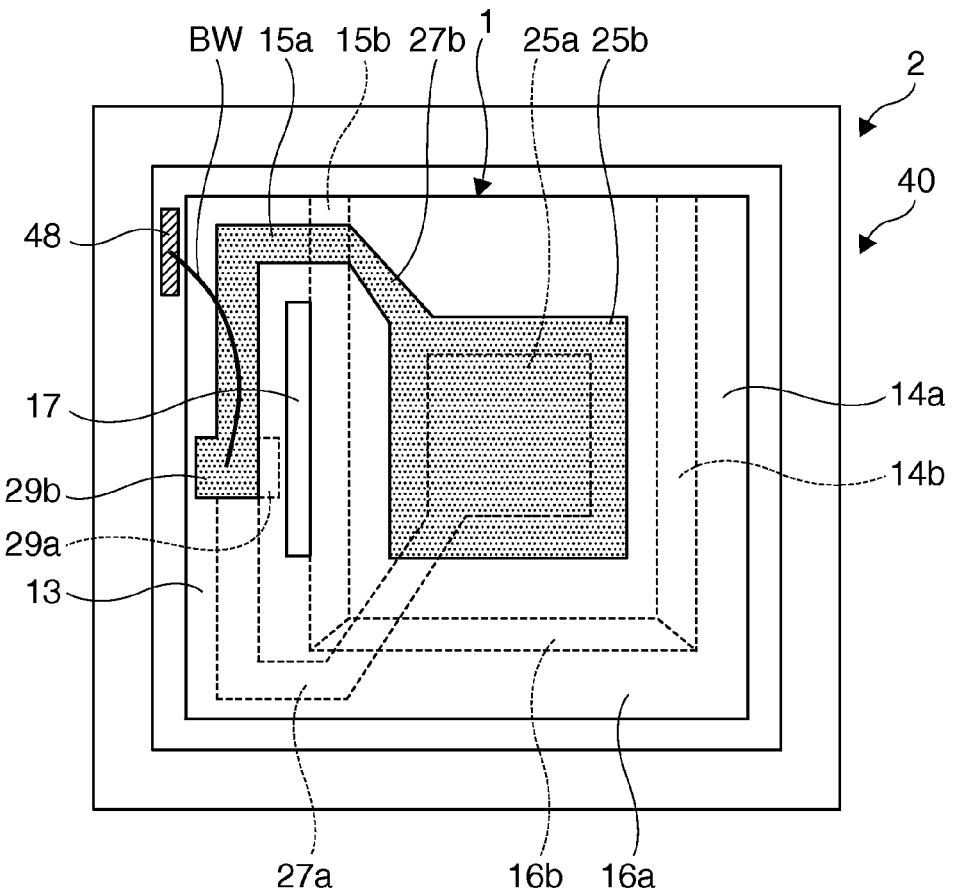
FIGS. 11A and 11B are schematic diagrams showing the structure of a piezoelectric resonator according to an embodiment of the invention, where
Figure 11B:
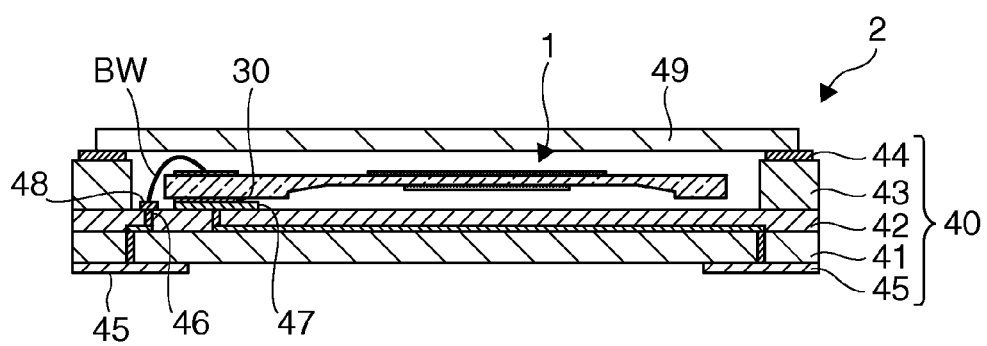

FIGS. 11A and 11B are schematic diagrams showing the configuration of a piezoelectric resonator that is an example of a resonator according to an embodiment of the invention, where FIG. 11A is a plan view in which a lid member is omitted and FIG. 11B is a longitudinal sectional view.

A piezoelectric resonator 2 is configured to include the piezoelectric resonator element 1, a package body 40 formed in a rectangular box shape so that the piezoelectric resonator element 1 is housed, and a lid member 49 formed of metal, ceramic, glass, or the like.

As shown in FIGS. 11A and 11B, the package body 40 is formed by laminating a first substrate 41, a second substrate 42, a third substrate 43, a seal ring 44, and a mounting terminal 45. A plurality of mounting terminals 45 are formed on the external bottom surface of the first substrate 41. The third substrate 43 is an annular body from which the central portion is removed. The seal ring 44, such as Kovar, is formed on the upper periphery of the third substrate 43.

A recess (cavity) in which the piezoelectric resonator element 1 is housed is formed by the second and third substrates 42 and 43. A plurality of element mounting pads 47 electrically connected to the mounting terminals 45 through a conductor 46 are provided at predetermined positions of the top surface of the second substrate 42. The element mounting pad 47 is disposed so as to correspond to the pad electrode 29a formed in the second thick portion body 15a when the piezoelectric resonator element 1 is placed.

When supporting and fixing the piezoelectric resonator element 1, first, the piezoelectric resonator element 1 is reversed (upside down) and the pad electrode 29a is placed on the element mounting pad 47, to which a conductive adhesive 30 has been applied, to put a load. Polyimide-based adhesive with low outgassing is used as the conductive adhesive 30 in consideration of aging.

Then, in order to cure the conductive adhesive 30, it is put into a high temperature furnace of a predetermined temperature for a predetermined time. After curing the conductive adhesive 30, the pad electrode 29b, which has been reversed to become on the top surface side, and the electrode terminal 48 of the package body 40 are electrically connected to each other using a bonding wire BW. As shown in FIG. 11B, since a portion in which the piezoelectric resonator element 1 is supported and fixed to the package body 40 is one place (one point), it is possible to reduce the magnitude of the stress caused by the support and fixing.

After performing annealing treatment, frequency adjustment is performed by adding a mass to the excitation electrode 25b or subtracting a mass from the excitation electrode 25b. Then, the lid member 49 is placed on the seal ring 44 formed on the top surface of the third substrate 43 of the package body 40, and the lid member 49 is sealed by seam welding in a vacuum state or in an atmosphere of nitrogen gas. In this manner, the piezoelectric resonator 2 is completed. Alternatively, there is also a method of placing the lid member 49 on the low-melting-point glass applied to the top surface of the package body 40 and bringing them into close contact with each other by welding. Also in this case, the cavity of the package is made to be in a vacuum state or is filled with inert gas, such as nitrogen gas, thereby completing the piezoelectric resonator 2.

It is also possible to form the piezoelectric resonator element 1 in which the pad electrodes 29a and 29b are spaced apart from each other in the Z'-axis direction. Also in this case, it is possible to form the piezoelectric resonator 2 in the same manner as for the piezoelectric resonator 2 described in FIGS. 11A and 11B. In addition, it is also possible to form the piezoelectric resonator element 1 in which the pad electrodes 29a and 29b are spaced apart from each other on the same plane. In this case, the piezoelectric resonator element 1 has a structure in which the conductive adhesive 30 is applied to two places (two points) for electrical connection and support and fixing. This is a structure suitable for low profile, but there is a possibility that the stress due to the conductive adhesive 30 will be slightly increased.

In the above embodiment of the piezoelectric resonator 2, an example using a laminated plate as the package body 40 has been described. However, it is also possible to form the piezoelectric resonator 2 using a single-layer ceramic plate as the package body 40 and using a cap after spinning as a lid.

Figure 12A:
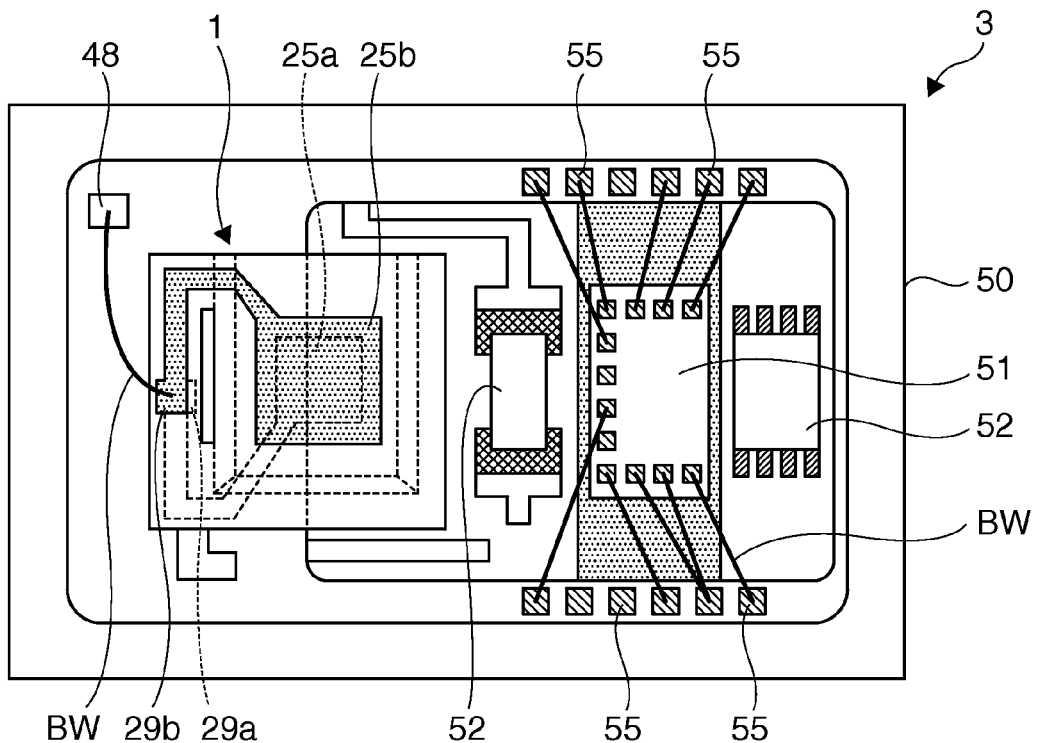
FIGS. 12A and 12B are schematic diagrams showing the structure of an electronic device according to an embodiment of the invention, where
Figure 12B:
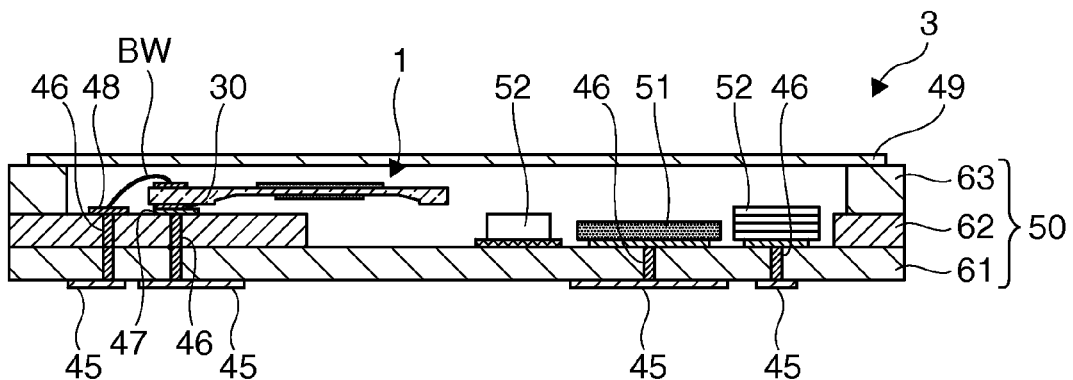

FIGS. 12A and 12B are schematic diagrams showing the configuration of an electronic device according to an embodiment of the invention, where FIG. 12A is a plan view in which a lid member is omitted and FIG. 12B is a longitudinal sectional view.

An electronic device 3 includes a package body 50, a lid member 49, and the piezoelectric resonator element 1, an IC component 51 in which an oscillation circuit for exciting the piezoelectric resonator element 1 is mounted, and at least one of electronic components 52, such as a variable capacitance element whose capacitance changes with a voltage, a thermistor having a resistance value changing with temperature, and an inductor.

As shown in FIGS. 12A and 12B, the package body 50 is formed by laminating a first substrate 61, a second substrate 62, and a third substrate 63. A plurality of mounting terminals 45 are formed on the external bottom surface of the first substrate 61. Each of the second and third substrates 62 and 63 is formed in the shape of an annular body from which the central portion is removed.

A recess (cavity) in which the piezoelectric resonator element 1, the IC component 51, the electronic component 52, and the like are housed is formed by the first to third substrates 61 to 63. A plurality of element mounting pads 47 electrically connected to the mounting terminals 45 through a conductor 46 are provided at predetermined positions of the top surface of the second substrate 62. The element mounting pad 47 is disposed so as to correspond to the pad electrode 29a formed in the second thick portion body 15a when the piezoelectric resonator element 1 is placed.

The pad electrode 29a of the reversed piezoelectric resonator element 1 is placed on the element mounting pad 47 of the package body 50, to which the conductive adhesive (polyimide-based adhesive) 30 is applied, for electrically connection between the pad electrode 29a and the element mounting pad 47. The pad electrode 29b located on the top surface side by reversal and the electrode terminal 48 of the package body 50 are connected to each other using the bonding wire BW, and they are electrically connected to one electrode terminal 55 of the IC component 51 through a conductor formed between the substrates of the package body 50. The IC component 51 is fixed to a predetermined position of the package body 50, and the terminal of the IC component 51 and the electrode terminal 55 of the package body 50 are connected to each other using the bonding wire BW. In addition, the electronic component 52 is placed at a predetermined position of the package body 50 and is connected to the conductor 46 using a metal bump or the like. The package body 50 is made to have a vacuum state or is filled with inert gas, such as nitrogen gas, and the package body 50 is sealed with the lid member 49, thereby completing the electronic device 3.

In the method of connecting the pad electrode 29b and the electrode terminal 48 of the package body 50 using the bonding wire BW, since a portion that supports the piezoelectric resonator element 1 is one place (one point), the stress caused by the conductive adhesive 30 is reduced. In addition, since the larger excitation electrode 25b is located on the top surface by reversing the piezoelectric resonator element 1 when the piezoelectric resonator element 1 is housed in the package body 50, frequency adjustment of the electronic device 3 becomes easy.

As shown in FIGS. 12A and 12B, since the high-frequency piezoelectric resonator element 1 that excites in the fundamental mode is used, unwanted spurious having an influence on the main vibration is suppressed. As a result, it is possible to obtain the high-frequency and small electronic device 3 having an excellent frequency-temperature characteristic or CI-temperature characteristic.

In addition, it is possible to configure a high-frequency and small piezoelectric oscillator, temperature compensated piezoelectric oscillator, voltage-controlled piezoelectric oscillator, or the like as the electronic device 3.

Next, an electronic apparatus (electronic apparatus of the invention) to which a piezoelectric resonator element, which is an example of the resonator element according to the embodiment of the invention, is applied will be described in detail with reference to FIGS. 13 to 15.

Figure 13:
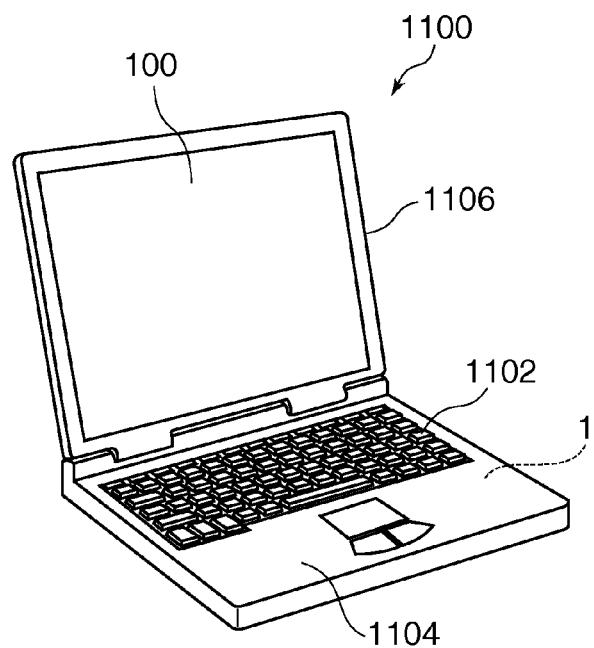
FIG. 13 is a perspective view showing the configuration of a mobile (or notebook) personal computer as an electronic apparatus including the resonator element according to an embodiment of the invention.

FIG. 13 is a perspective view showing the configuration of a mobile (or notebook) personal computer as an electronic apparatus including a piezoelectric resonator element that is an example of the resonator element according to the embodiment of the invention. In FIG. 13, a personal computer 1100 is configured to include a main body 1104 having a keyboard 1102 and a display unit 1106 having a display section 100, and the display unit 1106 is supported so as to be rotatable with respect to the main body 1104 through a hinge structure. The piezoelectric resonator element 1 that functions as a filter, a resonator, a reference clock, and the like is provided in the personal computer 1100.

Figure 14:
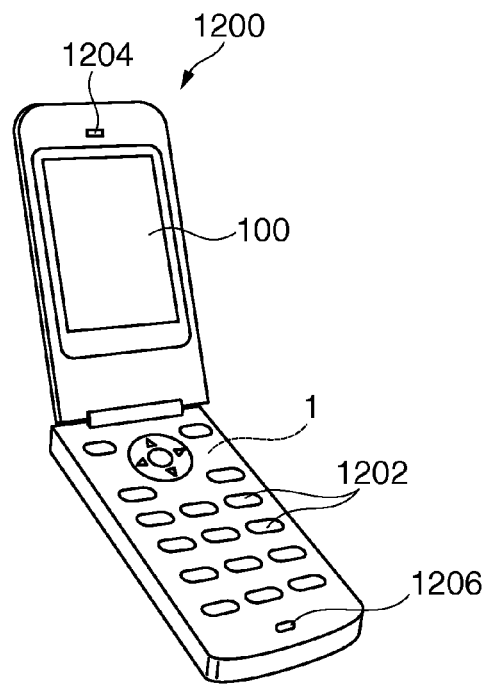
FIG. 14 is a perspective view showing the configuration of a mobile phone (PHS is also included) as an electronic apparatus including the resonator element according to an embodiment of the invention.

FIG. 14 is a perspective view showing the configuration of a mobile phone (PHS is also included) as an electronic apparatus including a piezoelectric resonator element that is an example of the resonator element according to the embodiment of the invention. In FIG. 14, a mobile phone 1200 includes a plurality of operation buttons 1202, an earpiece 1204, and a speaker 1206, and a display unit 100 is disposed between the operation buttons 1202 and the earpiece 1204. The piezoelectric resonator element 1 that functions as at least one of a filter, a resonator, and the like is provided in the mobile phone 1200.

Figure 15:
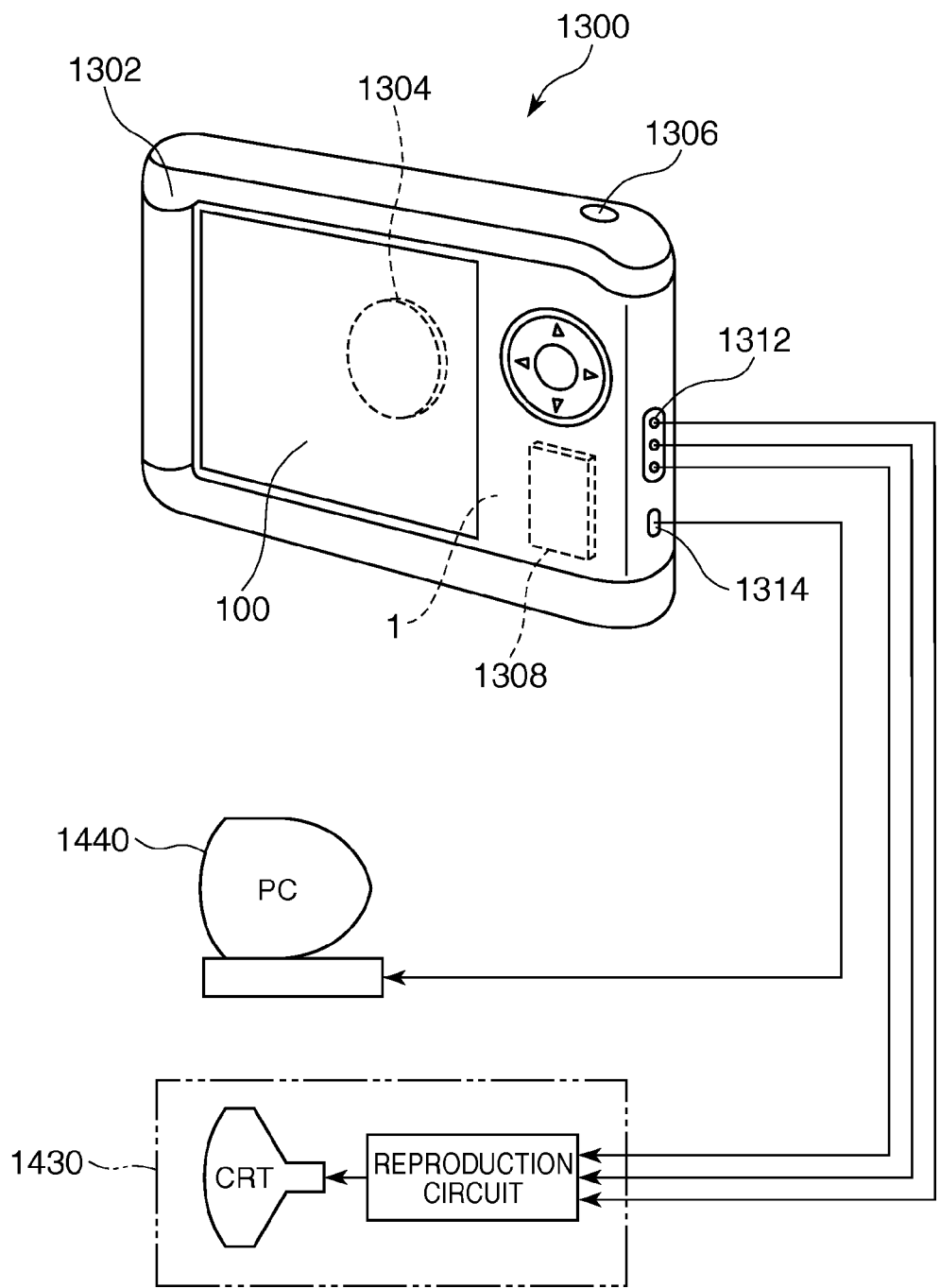
FIG. 15 is a perspective view showing the configuration of a digital camera as an electronic apparatus including the resonator element according to an embodiment of the invention.

FIG. 15 is a perspective view showing the configuration of a digital camera as an electronic apparatus including a piezoelectric resonator element that is an example of the resonator element according to the embodiment of the invention. In addition, in FIG. 15, connection with an external apparatus is also simply shown. Here, while a silver halide photograph film is exposed to light according to an optical image of the subject in a typical camera, the digital camera 1300 generates an imaging signal (image signal) by performing photoelectric conversion of an optical image of the subject using an imaging device, such as a Charge Coupled Device (CCD).

A display unit 100 is provided on the back of a case (body) 1302 in the digital camera 1300, so that display based on the imaging signal of the CCD is performed. The display unit 100 functions as a viewfinder that displays a subject as an electronic image. In addition, a light receiving unit 1304 including an optical lens (imaging optical system), a CCD, and the like is provided on the front side (back side in FIG. 15) of the case 1302.

When a photographer checks a subject image displayed on the display unit 100 and presses a shutter button 1306, an imaging signal of the CCD at that time is transferred and stored in a memory 1308. In addition, in this digital camera 1300, a video signal output terminal 1312 and an input and output terminal for data communication 1314 are provided on the side of the case 1302. In addition, as shown in FIG. 15, a television monitor 1430 is connected to the video signal output terminal 1312 and a personal computer (PC) 1440 is connected to the input and output terminal for data communication 1314 when necessary. In addition, an imaging signal stored in the memory 1308 is output to the television monitor 1430 or the personal computer 1440 through a predetermined operation. The piezoelectric resonator element 1 that functions as a filter, a resonator, and the like is provided in the digital camera 1300.

In addition, the electronic apparatus including a piezoelectric resonator element that is an example of the resonator element according to the embodiment of the invention can be applied not only to the personal computer (mobile personal computer) shown in FIG. 13, the mobile phone shown in FIG. 14, and the digital camera shown in FIG. 15 but also to an ink jet type discharge apparatus (for example, an ink jet printer), a laptop type personal computer, a television, a video camera, a video tape recorder, a car navigation apparatus, a pager, an electronic diary (electronic diary with a communication function is also included), an electronic dictionary, an electronic calculator, an electronic game machine, a word processor, a workstation, a video phone, a television monitor for security, electronic binoculars, a POS terminal, medical equipment (for example, an electronic thermometer, a sphygmomanometer, a blood sugar meter, an electrocardiographic measurement device, an ultrasonic diagnostic apparatus, and an electronic endoscope), a fish detector, various measurement apparatuses, instruments (for example, instruments for vehicles, aircraft, and ships), and a flight simulator.

The entire disclosure of Japanese Patent Application No. 2012-128661, filed Jun. 6, 2012 is expressly incorporated by reference herein.

What is claimed is:

1. A resonator element comprising:
a substrate including a vibrating portion that performs thickness-shear vibration in a first direction and an excitation electrode provided on top and bottom main surfaces of the vibrating portion, wherein
when an average plate thickness calculated from plate thicknesses of a plurality of regions of the vibrating portion is H and a plate thickness difference between maximum and minimum values of the plate thicknesses is $\Delta H$, $0\% < \Delta H/H \leq 0.085\%$ is satisfied, and
the substrate includes:
a first region having the vibrating portion; and
a second region that is continuously formed from an outer peripheral of the first region, wherein
a first thickness of the first region is smaller than a second thickness of the second region,
the outer peripheral of the first region includes:
first and second peripherals extended in a second direction perpendicular to the first direction; and
third and fourth peripherals extended in the first direction, wherein
the first and second peripherals are separated in the first direction, and
the third and fourth peripherals are separated in the second direction, and
the second region includes:
a first inclined portion in which a thickness increases from a first end that is continuously connected to the first peripheral toward a second end,
a first thick body portion that is continuously connected to the second end of the first inclined portion,
a second inclined portion in which a thickness increases from a third end that is continuously connected to the second peripheral toward a fourth end,
a second thick body portion that is continuously connected to the fourth end of the second inclined portion,
a third inclined portion in which a thickness increases from a fifth end that is continuously connected to the third peripheral toward a sixth end, and
a third thick body portion that is continuously connected to the sixth end of the third inclined portion.

2. The resonator element according to claim 1, wherein a resonance frequency is equal to or higher than 200 MHz.

3. A resonator comprising:
the resonator element according to claim 1; and
a package in which the resonator element is housed.

4. An electronic apparatus comprising the resonator according to claim 3.

5. An electronic device comprising:
the resonator element according to claim 1; and
an oscillation circuit that excites the resonator element.

6. An electronic apparatus comprising the resonator element according to claim 1.

7. A method of manufacturing a resonator element comprising:
preparing a substrate having a surface on which a mask with an opening is formed, the substrate having a vibrating portion performing a thickness-shear vibration in a first direction;
fixing the substrate to a substrate holder while one of the first direction and a second direction perpendicular to the first direction is an up-down direction,
washing the substrate and the substrate holder by pure water;
immersing the substrate and the substrate holder into hot water containing a surfactant;
immersing the substrate and the substrate holder into an etching bath having an etching solution so as to etch an exposed area of the substrate by the opening of the mask;
pulling up the substrate and the substrate holder from the etching bath;
turning the substrate upside down with respect to the up-down direction;
immersing the substrate, which is turned upside down, and the substrate holder into the hot water containing the surfactant; and
immersing the substrate, which is turned upside down, and the substrate holder into the etching bath so as to etch the exposed area of the substrate by the opening of the mask, wherein
when the substrate is immersed into the etching bath, a main surface of the substrate is perpendicular to a surface of the etching solution in the etching bath, and
the substrate includes:
a first region having the vibrating portion; and
a second region that is continuously formed from an outer peripheral of the first region, wherein
a first thickness of the first region is smaller than a second thickness of the second region,
the outer peripheral of the first region includes:
first and second peripherals extended in a second direction perpendicular to the first direction; and
third and fourth peripherals extended in the first direction, wherein
the first and second peripherals are separated in the first direction, and
the third and fourth peripherals are separated in the second direction, and
the second region includes:
a first inclined portion in which a thickness increases from a first end that is continuously connected to the first peripheral toward a second end,
a first thick body portion that is continuously connected to the second end of the first inclined portion,
a second inclined portion in which a thickness increases from a third end that is continuously connected to the second peripheral toward a fourth end,
a second thick body portion that is continuously connected to the fourth end of the second inclined portion,
a third inclined portion in which a thickness increases from a fifth end that is continuously connected to the third peripheral toward a sixth end, and
a third thick body portion that is continuously connected to the sixth end of the third inclined portion.

8. The method of manufacturing a resonator elements according to claim 7, wherein
a temperature of the etching solution in the etching bath is substantially the same as a temperature of the hot water.

* * * * *